United States Patent
Kim et al.

(10) Patent No.: US 10,168,474 B2
(45) Date of Patent: Jan. 1, 2019

(54) METHOD OF MANUFACTURING OPTICAL INPUT/OUTPUT DEVICE

(71) Applicant: Electronics and Telecommunications Research Institute, Daejeon (KR)

(72) Inventors: Gyungock Kim, Daejeon (KR); Hyundai Park, Daejeon (KR); In Gyoo Kim, Daejeon (KR); Sang Hoon Kim, Daejeon (KR); Ki Seok Jang, Daejeon (KR); Sang Gi Kim, Daejeon (KR); Jiho Joo, Daejeon (KR); Yongseok Choi, Daejeon (KR); Hyuk Je Kwon, Daejeon (KR); Jaegyu Park, Daejeon (KR); Sun Ae Kim, Daejeon (KR); Jin Hyuk Oh, Daejeon (KR); myung joon Kwack, Gyeonggi-do (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 5 days.

(21) Appl. No.: 15/607,726

(22) Filed: May 30, 2017

(65) Prior Publication Data
US 2017/0269298 A1 Sep. 21, 2017

Related U.S. Application Data

(62) Division of application No. 14/062,454, filed on Oct. 24, 2013, now Pat. No. 9,690,042.

(30) Foreign Application Priority Data

May 23, 2013 (KR) .................. 10-2013-0058195
Aug. 21, 2013 (KR) .................. 10-2013-0099082

(51) Int. Cl.
*G02B 6/12* (2006.01)
*G02B 6/42* (2006.01)
(Continued)

(52) U.S. Cl.
CPC .......... *G02B 6/12004* (2013.01); *G02B 6/13* (2013.01); *G02B 6/4206* (2013.01);
(Continued)

(58) Field of Classification Search
CPC ....... G02B 6/12004; G02B 6/13; H01L 27/15; H01L 21/762
(Continued)

(56) References Cited

U.S. PATENT DOCUMENTS 6,281,032 B1 * 8/2001 Matsuda ................ B82Y 20/00
257/E21.088
6,458,614 B1 10/2002 Nanishi et al.
(Continued)

FOREIGN PATENT DOCUMENTS

KR 10-2012-0016188 A 2/2012

OTHER PUBLICATIONS

Yutaka Urino, et al., "Demonstration of 12.5-Gbps optical interconnects integrated with lasers, optical splitters, optical modulators and photodetectors on a single silicon substrate", Optics Express, vol. 20, No. 26, pp. B256-B263, Dec. 2012.

*Primary Examiner* — Igwe U Anya
(74) *Attorney, Agent, or Firm* — Rabin & Berdo, P.C.

(57) ABSTRACT

Disclosed are an optical input/output device and an optoelectronic system including the same. The device includes a bulk silicon substrate, at least one vertical-input light detection element monolithically integrated on a portion of the bulk silicon substrate, and at least one vertical-output light source element monolithically integrated on another portion of the bulk silicon substrate adjacent to the vertical-input
(Continued)

light detection element. The vertical-output light source element includes a III-V compound semiconductor light source active layer combined with the bulk silicon substrate by a wafer bonding method.

3 Claims, 16 Drawing Sheets

(51) Int. Cl.
    *G02B 6/13*     (2006.01)
    *H01L 21/762*     (2006.01)
    *H01L 27/15*     (2006.01)
    *H01L 31/167*     (2006.01)

(52) U.S. Cl.
    CPC .......... *G02B 6/4214* (2013.01); *H01L 21/762* (2013.01); *H01L 27/15* (2013.01); *H01L 31/167* (2013.01)

(58) Field of Classification Search
    USPC .............................................. 257/84; 438/80
    See application file for complete search history.

(56) References Cited

U.S. PATENT DOCUMENTS

| | | |
|---|---|---|
| 6,852,968 B1 | 2/2005 | Ouchi et al. |
| 6,868,214 B1 | 3/2005 | Sakata et al. |
| 7,053,415 B2 | 5/2006 | Swirhun et al. |
| 7,373,033 B2 | 5/2008 | Lu et al. |
| 8,120,044 B2 | 2/2012 | Cho et al. |
| 8,197,147 B2 | 6/2012 | Lee et al. |
| 8,213,751 B1 | 7/2012 | Ho et al. |
| 8,426,921 B2 | 4/2013 | Assefa et al. |
| 2002/0048900 A1 | 4/2002 | Lo et al. |
| 2002/0105256 A1 | 8/2002 | Kim et al. |
| 2003/0022414 A1* | 1/2003 | Lian ...................... H01L 27/144 438/80 |
| 2003/0218666 A1 | 11/2003 | Holm et al. |
| 2004/0089939 A1 | 5/2004 | Ogihara et al. |
| 2005/0053319 A1 | 3/2005 | Doan |
| 2006/0197960 A1 | 9/2006 | Bazylenko |
| 2008/0197362 A1 | 8/2008 | Hisamoto et al. |
| 2008/0296617 A1 | 12/2008 | Mishra et al. |
| 2009/0039361 A1 | 2/2009 | Li et al. |
| 2009/0242935 A1 | 10/2009 | Fitzgerald |
| 2010/0026779 A1 | 2/2010 | Yonehara et al. |
| 2010/0038689 A1 | 2/2010 | Ahn et al. |
| 2010/0133551 A1 | 6/2010 | Lee et al. |
| 2011/0085577 A1 | 4/2011 | Krasulick et al. |
| 2012/0057816 A1 | 3/2012 | Krasulick et al. |
| 2012/0189317 A1 | 7/2012 | Heck et al. |
| 2013/0039664 A1* | 2/2013 | Clifton ................ H01L 31/0352 398/200 |
| 2013/0236183 A1* | 9/2013 | Chao .................... H04B 10/116 398/101 |
| 2013/0320404 A1 | 12/2013 | Usenko |

\* cited by examiner

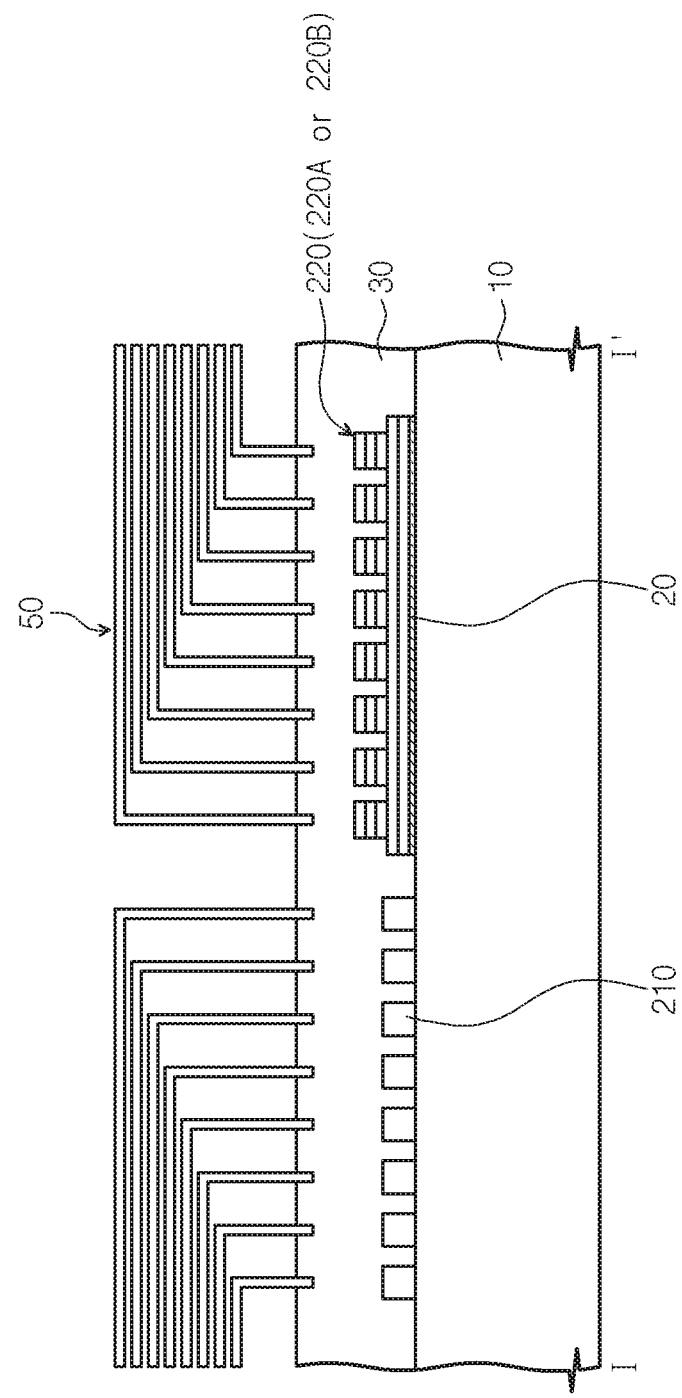

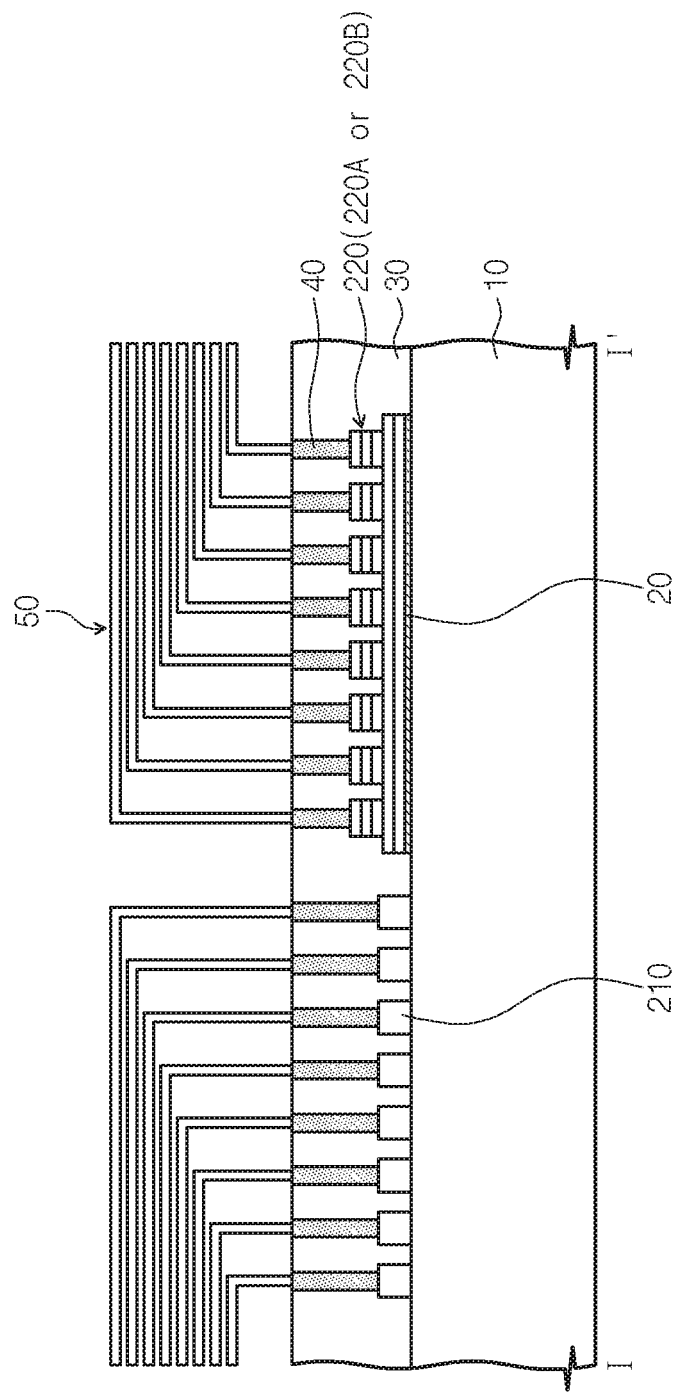

METHOD OF MANUFACTURING OPTICAL INPUT/OUTPUT DEVICE

CROSS-REFERENCE TO RELATED APPLICATION

This is a divisional application of U.S. patent application Ser. No. 14/062,454, filed on Oct. 24, 2013 (allowed on Feb. 23, 2017). Further, this U.S. non-provisional patent application claims priority under 35 U.S.C. § 119 to Korean Patent Application Nos. 10-2013-0058195 and 10-2013-0099082, filed on May 23, 2013 and Aug. 21, 2013. The entire contents of these prior U.S. and Korean applications are hereby incorporated by reference.

BACKGROUND

The inventive concepts relate to a semiconductor device and, more particularly, to an optical input/output (I/O) device, an opto-electronic system including the same, and a method of manufacturing the same.

Semiconductor devices such as a central processing unit (CPU), a memory device, and a logic circuit of a computer may be mostly integrated on a silicon substrate. Semiconductor chips consisting of such integrated circuits may transmit and receive signals through metal interconnections. However, an interconnecting method using the metal interconnections may cause problems such as reduction of signal processing speeds, generated heat in proportion to a cumulative usage time, and crosstalk. Thus, optical data communication between chips or within a chip based on silicon photonics technology are being demanded in order to realize high performance and high-speed computer systems, high-capacity data communication systems and image processing systems. In order to satisfy future demands, various researches are conducted for silicon photonics technologies for silicon chip-level optical data interconnections.

Generally, silicon optical communication devices developed in the silicon photonics technology are mainly optical waveguide type silicon photonics devices using a silicon-on-insulator (SOI) substrate, not a conventional bulk silicon substrate on which a complementary metal-oxide semiconductor (CMOS) integrated circuit is realized. Currently, silicon optical interconnections based on the waveguide-type silicon photonics devices are being investigated. However, the SOI substrate is expensive compared with the bulk silicon substrate. This is because a buried oxide (BOX) layer should be formed to be near to a surface of a silicon substrate by additional processes when the SOI substrate is manufactured. Due to crystal defects of the substrate caused by the formation of the BOX layer, performance of an electronic device based on the SOI substrate may be deteriorated as compared with performance of an electronic based on a mature and well-established bulk silicon substrate of a conventional art. Additionally, when an opto-electronic convergence chip is manufactured, a manufacturing process of an electronic integrated circuit is changed into techniques based on the SOI substrate such that additional efforts and costs are increased. Also, it may be the same case when optical waveguide-type silicon photonics devices are integrated on a SOI portion locally formed on the bulk silicon substrate. When the local SOI part is formed on the bulk silicon substrate, various additional processes (e.g., a high temperature thermal treatment process) are required, which can deteriorate the performance of an integrated circuit formed on the same bulk silicon substrate. The optical waveguide silicon photonics device formed on the local SOI part may have demerits such as high optical loss and low performance.

A light source for silicon optical input/output (I/O) is based on a III-V compound semiconductor light source. Integration a silicon photonics-based light source may be realized by a hybrid laser, a die-bonding packaging, or a printed circuit board (PCB) module packaging. In the hybrid laser, an optical waveguide-based light source such as a III-V compound semiconductor distributed feedback laser diode (DFB LD) is bonded on the SOI substrate by a wafer bonding technique. In the die-bonding packaging method, a III-V compound semiconductor DFB LD chip is mounted on a SOI-based silicon photonics chip by a flip-chip bonding technique. All of the hybrid laser method and the die-bonding package method should fundamentally use expensive SOI substrates. Thus, productivity of conventional optical I/O devices based on a SOI substrate is low.

Thus, all of electronic circuits and optical components should be realized on the same bulk silicon substrate in order that silicon photonics devices are practically used in silicon integrated circuits. Therefore, there is a need for new optical I/O device structures capable of realizing merits such as high performance, high speed, high efficiency, high-level functionality, low manufacture costs, and low packaging costs.

SUMMARY

Embodiments of the inventive concepts may provide an optical input/output (I/O) device including optical devices monolithically integrated on a bulk silicon substrate, and/or an opto-electronic system including the same.

Embodiments of the inventive concepts may also provide an optical input/output (I/O) device capable of improving productivity and/or an opto-electronic system including the same.

In one aspect, an optical input/output (I/O) device may include: a bulk silicon substrate; at least one vertical-input (normal-incident, surface-illuminating) light detection element monolithically integrated on a portion of the bulk silicon substrate; and at least one vertical-output (surface-emitting) light source element monolithically integrated on another portion of the bulk silicon substrate adjacent to the vertical-input light detection element. The vertical-output light source element includes a III-V compound semiconductor light source active layer monolithically integrated on the bulk silicon substrate by a wafer bonding.

In some embodiments, the vertical-input light detection element may include germanium.

In some embodiments, the vertical-input light detection element may include a photodiode including $Ge_{1-x}Si_x/Ge_{1-y}Si_y$ superlattice ($0 \le x,y \le 1$), germanium-based quantum dots, a germanium-based quantum wire array, or silicon.

In some embodiments, the vertical-output light source element may include a surface emitting laser or a surface emitting light emitting diode (LED).

In some embodiments, the optical input/output device may further include: a passivation layer on the vertical-output light source element and the vertical-input light detection element.

In some embodiments, the passivation layer may include silicon oxide.

In some embodiments, the passivation layer may have holes exposing the vertical-output light source element and the vertical-input light detection element. In this case, the optical input/output device may further include: optical vias formed in the holes, respectively.

In some embodiments, the optical vias may include silicon nitride.

In some embodiments, the optical input/output device may further include: horizontal optical waveguides provided on the passivation layer and coupled to the optical vias.

In some embodiments, the optical input/output device may further include: a passive optical circuit provided on the passivation layer. The passive optical circuit may include optical multiplexer/demultiplexer (MUX/DEMUX), an optical switch, or a grating coupler; and the passive optical circuit may be coupled to the horizontal optical waveguide.

In some embodiments, the optical input/output device may further include: a complementary metal-oxide semiconductor (CMOS) interface circuitry electrically connected to the vertical-input light detection element or the vertical-output light source element. The CMOS interface circuitry may be monolithically integrated on the bulk silicon substrate.

In another aspect, an optical input/output device may include: a bulk silicon substrate; at least one vertical-input light detection element monolithically integrated on a portion of the bulk silicon substrate; a III-V compound semiconductor substrate mounted on another portion of the bulk silicon substrate by a die-bonding; and at least one vertical-output light source element on the III-V compound semiconductor substrate.

In some embodiments, the vertical-output light source element may include a III-V compound semiconductor light source active layer.

In still another aspect, an opto-electronic system may include: a plurality of signal processing chips. Each of the signal processing chips may include: a bulk silicon substrate; a signal processing circuit integrated on the bulk silicon substrate; and a vertical-input light detection element array and a vertical-output light source element array that are connected to the signal processing circuit and are monolithically integrated on the bulk silicon substrate. The plurality of signal processing chips may be three-dimensionally stacked. The vertical-input light detection element arrays and the vertical-output light source element arrays of the signal processing chips may face each other in one-to-one correspondence such that the plurality of signal processing chips may be three-dimensionally optically coupled to each other.

In some embodiments, the vertical-output light source element array may include a III-V compound semiconductor light source active layer bonded to the bulk silicon substrate by a wafer bonding method.

In some embodiments, the signal processing device may include a central processing unit (CPU), a memory circuit, a data bus interface circuit, a peripheral control circuit, an user definition application-specific integrated circuit (ASIC), or an optical communication circuit.

In yet another aspect, a method of manufacturing an optical input/output device may include: providing a bulk silicon substrate; monolithically integrating a vertical-input light detection element on a portion of the bulk silicon substrate; and monolithically integrating a vertical-output light source element on another portion of the bulk silicon substrate. Monolithically integrating the vertical-output light source element may include: forming an element passivation layer covering the vertical-input light detection element on the portion of the bulk silicon substrate; bonding a wafer including a III-V compound semiconductor substrate and a III-V compound semiconductor light source active layer on the III-V compound semiconductor substrate to the another portion of the bulk silicon substrate; removing the III-V compound semiconductor substrate; patterning the III-V compound semiconductor light source active layer to form the vertical-output light source element; and forming a passivation layer on the vertical-input light detection element and the vertical-output light source element.

BRIEF DESCRIPTION OF THE DRAWINGS

The inventive concepts will become more apparent in view of the attached drawings and accompanying detailed description.

FIG. 2 is a cross-sectional view taken along lines I-I' of FIG. 1A or 1B;

FIG. 3 is a cross-sectional view illustrating a modified example of an opto-electronic system of FIG. 2;

DETAILED DESCRIPTION OF THE EMBODIMENTS

Figure 1A:
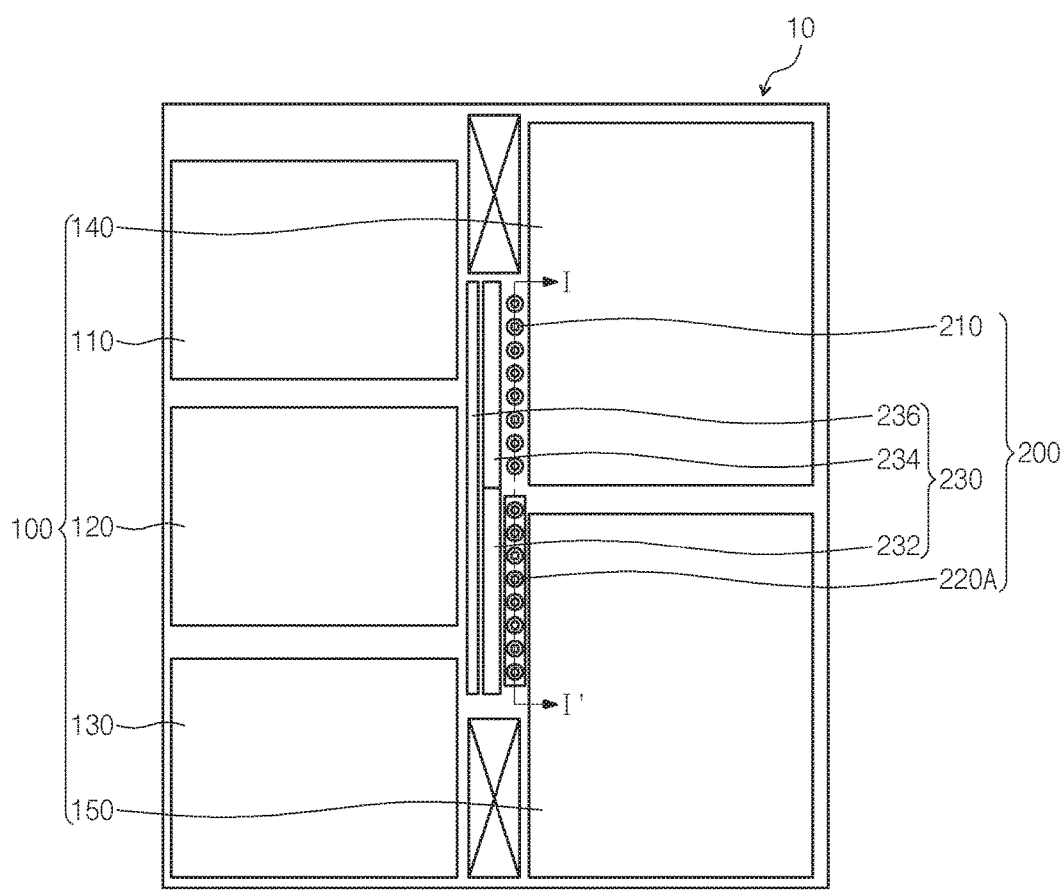
FIGS. 1A and 1B are plan views illustrating opto-electronic systems according to a first embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
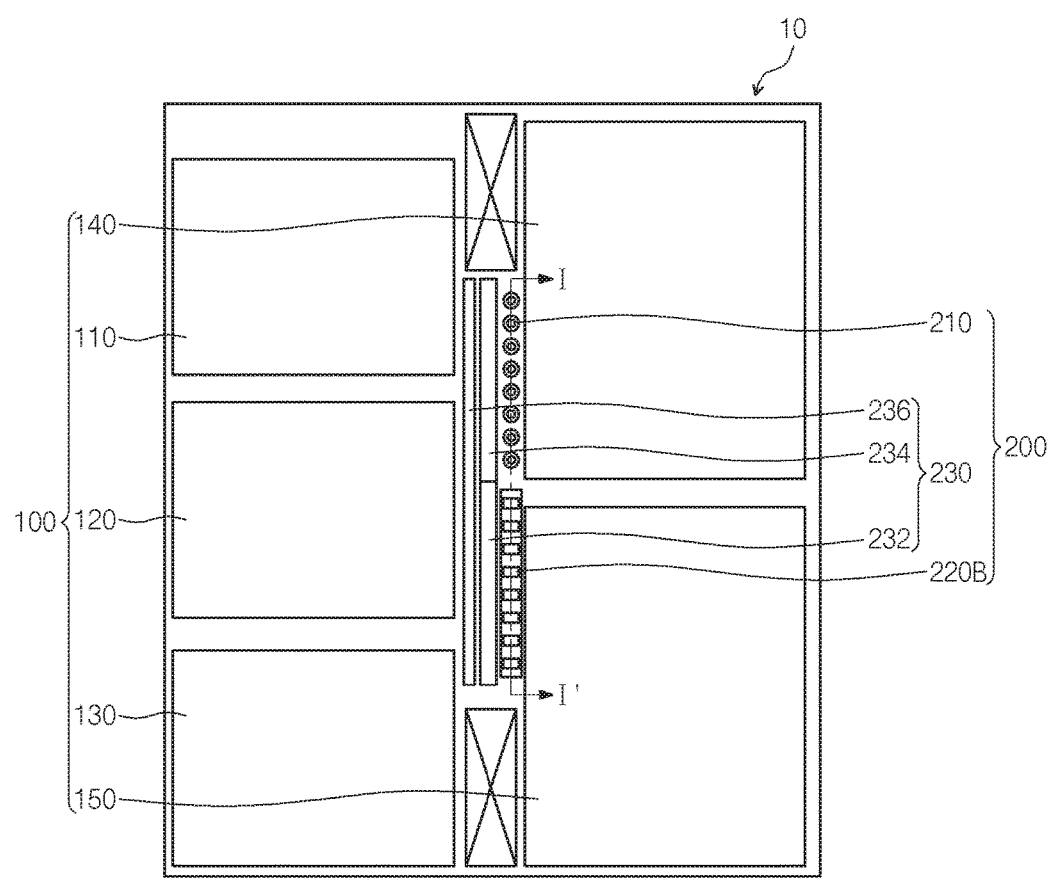

FIGS. 1A and 1B are plan views illustrating opto-electronic systems according to a first embodiment of the inventive concepts. FIG. 2 is a cross-sectional view taken along lines I-I' of FIG. 1A or 1B.

Referring to FIGS. 1A, 1B, and 2, an opto-electronic system according to a first embodiment of the inventive concepts may include a signal processing device 100 and an optical input/output (I/O) device 200 that are integrated in a bulk silicon substrate 10. The signal processing device 100 may process and control input/output (I/O) signals of the optical I/O device 200. The signal processing device 100 may include one or more signal processing sub-devices 110, 120, 130, 140, and 150. The signal processing sub-devices 110 to 150 may include a central processing unit (CPU), a memory circuit, an application-specific integrated circuit (ASIC), a data bus interface circuit, a peripheral control circuit, an user definition ASIC, and/or a block of an optical communication circuit. However, the inventive concepts are not limited thereto. In other embodiments, the signal processing device 100 may be one-chip system including a CPU region, a memory region, an ASIC region, a data bus interface circuit region, a peripheral control device region, an user definition ASIC region, and/or an optical communication circuit region.

The optical I/O device 200 may be used instead of a conventional electrical signal I/O device. The optical I/O device 200 may be monolithically integrated on the bulk silicon substrate 10. The optical I/O device 200 may include vertical-input light detection elements 210, vertical-output light source elements 220 (i.e., surface emitting light source elements), and a complementary metal-oxide semiconductor (CMOS) interface circuitry 230. The vertical-input light detection elements 210 may be a light receiving part and the vertical-output (surface emitting) light source elements 220 may be a light transmitting part. The vertical-output light source elements 220 may include a surface emitting laser 220A illustrated in FIG. 1A or a surface emitting light emitting diode (LED) 220B illustrated in FIG. 1B. The vertical-input light detection elements 210 may include a photodiode having a light absorption layer of germanium-on-silicon. A 100% germanium-on-silicon vertical-input light detection elements 210 may absorb light having a wavelength band of 650 nm to about 1600 nm.

However, the inventive concepts are not limited thereto. In other embodiments, the vertical-input light detection elements 210 may include a photodiode including $Ge_{1-x}Si_x/Ge_{1-y}Si_y$ superlattice ($0 \le x,y \le 1$), germanium-based quantum dots, or a germanium-based quantum wire array. In still other embodiments, the vertical-input light detection elements 210 may include a silicon photodiode. In these cases, a wavelength of light may be shorter than 650 nm.

The vertical-output light source elements 220 may include a III-V compound semiconductor light source active layer bonded by a wafer bonding technique. The vertical-output light source elements 220 may be monolithically integrated on the bulk silicon substrate 10. Here, the vertical-output light source elements 220 may include an surface emitting laser such as a vertical-cavity surface-emitting laser (VC-SEL) or a surface-emitting distributed-feedback diode laser. The vertical-output light source elements 220 may be bonded to the bulk silicon substrate 10 by an adhesive layer 20. The adhesive layer 20 may include an oxide layer or an adhesive material. According to some embodiments, the adhesive layer 20 may have a thickness of several nanometers to several hundred nanometers. The adhesive layer 20 may mean a silicon oxide layer for a wafer bonding technique. Since the bulk silicon substrate 10 is cheap compared with a conventional silicon-on-insulator (SOI) substrate, commercialization of the opto-electronic system may be increased.

The vertical-input light detection elements 210 and the vertical-output light source elements 220 may constitute a vertical-input/output array. The CMOS interface circuitry 230 may interface the signal processing device 100 with the vertical-input light detection elements 210 or the vertical-output light source elements 220. The CMOS interface circuitry 230 may include a trans-impedance amplifier (TIA) 232, a light source driver 234, a limiting amplifier (LA) 236, a serialize/deserialize circuit, a clock-data-recovery (CDR) circuit, a PLL circuit, and/or a protocol integrated circuit.

The vertical-output light source elements 220 may emit light having a wavelength of 480 nm, 650 nm, 780 nm, 850 nm, 980 nm, 1310, or 1550 nm. If various wavelengths in each band are realized using a combination of the light sources emitting different wavelength, a wavelength division multiplexing (WDM) function may be added. If a wafer-bonded VCSEL having a wavelength of 850 nm is applied, a multi-mode optical fiber 50 having a low light coupling loss may be used. If a wafer-bonded VCSEL having a wavelength of 650 nm is applied, low cost plastic optical fibers (POF) 50 may be used.

A first passivation layer 30 may be provided on the vertical-input light detection elements 210 and the vertical-output light source elements 220. The first passivation layer 30 may include a silicon oxide layer. Optical fibers 50 may be formed on the first passivation layer 30. The optical fibers 50 may be connected to the vertical-input light detection elements 210 and the vertical-output light source elements 220.

FIG. 3 illustrates a modified example of an opto-electronic system of FIG. 2. Referring to FIG. 3, an optical I/O device 200 may include optical vias 40 disposed between the vertical-input light detection elements 210 and the optical fibers 50 and/or between the vertical-output light source elements 220 and the optical fibers 50. The optical vias 40 are vertical optical waveguides penetrating the first passivation layer 30 between the vertical-input light detection elements 210 and the optical fibers 50 and/or between the vertical-output light source elements 220 and the optical fibers 50.

The optical vias 40 may include silicon nitride ($Si_xN_y$). For example, "x" may be 3 and "y" may be 4. A refractive index of the silicon nitride may be about 2. A refractive index of the first passivation layer 30 may be about 1.537. The optical vias 40 may vertically guide light. The optical vias 40 may improve optical coupling efficiency between the optical fibers 50 and the vertical-input light detection elements 210. The optical vias 40 may improve optical coupling efficiency between the optical fibers 50 and the vertical-output light source elements 220. However, the inventive concepts are not limited thereto. Embodiments of the inventive concepts may be variously modified.

As described above, the optical I/O device 200 of FIG. 3 further includes the optical vias 40 disposed in the first passivation layer 30 between the vertical-input light detection elements 210 and the optical fibers 50 and/or between the vertical-output light source elements 220 and the optical fibers 50.

Figure 4:
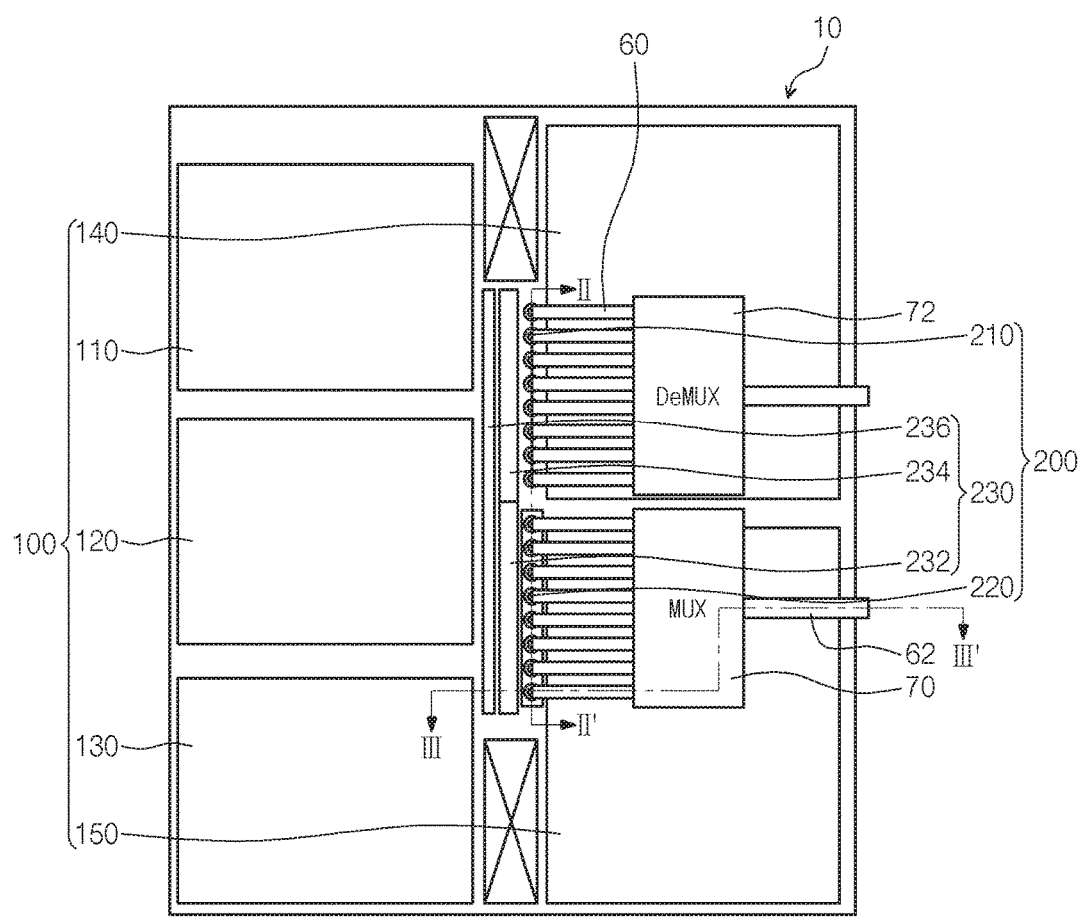
FIG. 4 is a plan view illustrating an opto-electronic system according to a second embodiment of the inventive concepts.
Figure 5:
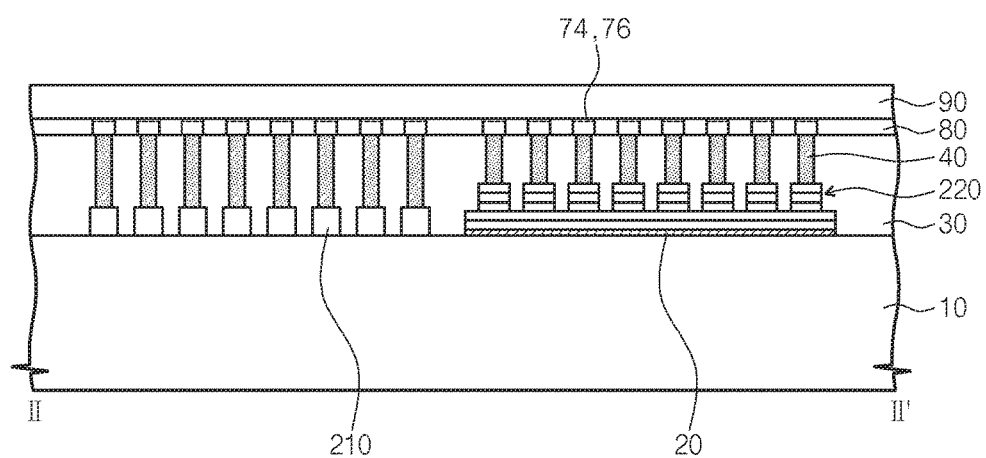
FIG. 5 is a cross-sectional view taken along a line II-II' of FIG. 4.
Figure 6:
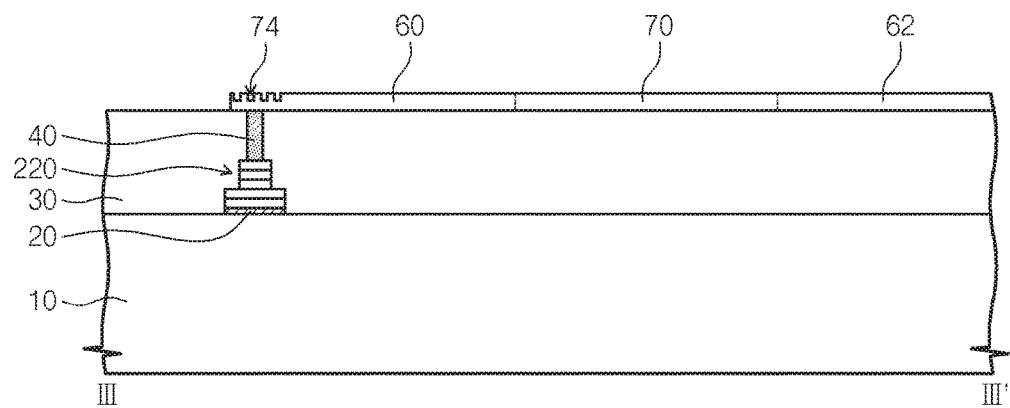
FIGS. 6 and 7 are cross-sectional views taken along a line III-III' of FIG. 4.
Figure 7:
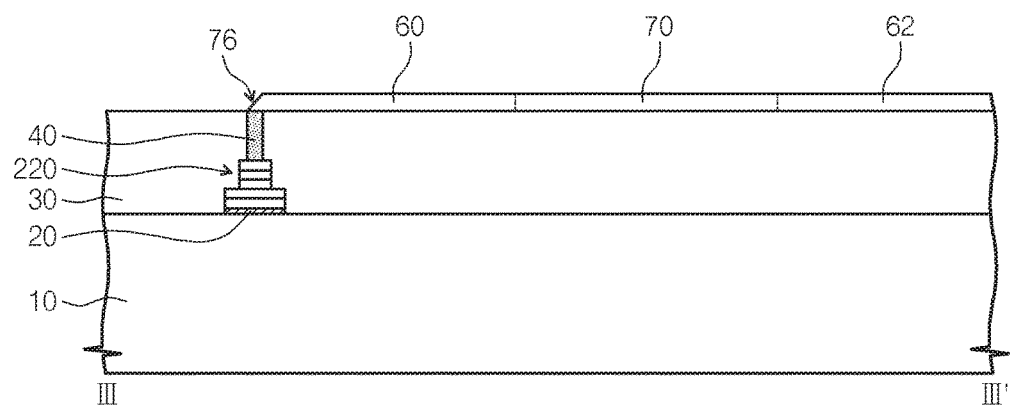

FIG. 4 is a plan view illustrating an opto-electronic system according to a second embodiment of the inventive concepts. FIG. 5 is a cross-sectional view an optical I/O device 200 taken along a line II-II' of FIG. 4. FIGS. 6 and 7 are cross-sectional views taken along a line III-III' of FIG. 4 to illustrate optical vias 40 bonded to horizontal optical waveguides 60 of the optical I/O device 200. In the present embodiment, the descriptions to the same elements as or similar elements to corresponding elements of the first embodiment will be omitted or mentioned briefly. In other words, differences between the present embodiment and the first embodiment will be mainly described.

Referring to FIGS. 4 to 7, optical vias 40 of an optical I/O device 200 may be connected to a plurality of horizontal optical waveguides 60. The horizontal optical waveguides 60 may be optically coupled to the optical vias 40 through, for example, grating couplers 74 of FIG. 6 or mirror surfaces 76 having a tilt angle of 45 degrees in FIG. 7. The grating coupler 74 may be replaced with the mirror surface 76 having the tilt angle of 45 degrees.

The horizontal optical waveguides 60 optically coupled to the vertical-output light source elements 220 may be coupled to an optical multiplexer (MUX) 70. The optical MUX 70 may output optical signals of a plurality of wavelengths to a single horizontal optical waveguide 62. The horizontal optical waveguides 60 optically coupled to the vertical-input light detection elements 210 may be coupled to an optical demultiplexer (DEMUX) 72 based on a dielectric. The optical DEMUX 72 may divide an optical signal inputted through a single horizontal optical waveguide 62 into signals of a plurality of wavelengths. The optical DEMUX 72 may individually provide the divided signals to the vertical-input light detection elements 210. Passive optical element circuits such as the plurality of horizontal optical waveguides 60, the single horizontal optical waveguide 62, and the optical MUX/DEMUX 70 and 72 may be formed in a second passivation layer 80. A third passivation layer 90 may cover the passive optical element circuits and the second passivation layer 80. Here, the passive optical element circuits such as the plurality of horizontal optical waveguides 60, the single horizontal optical waveguide 62, and the optical MUX/DEMUX 70 and 72 may include silicon nitride. The second passivation layer 80 and the third passivation layer 90 may include silicon oxide.

An optical functional dielectric layer (e.g., the horizontal optical waveguides 60, the grating coupler 74, a WDM device, an optical switch, or a functional passive optical element circuit) may be monolithically integrated on the vertical-input light detection elements 210 and the vertical-output light source elements 220 that are monolithically integrated on the bulk silicon substrate 10. Thus, the opto-electronic system according to the second embodiment may provide a high function/high performance opto-electronic convergence chip system.

Figure 8:
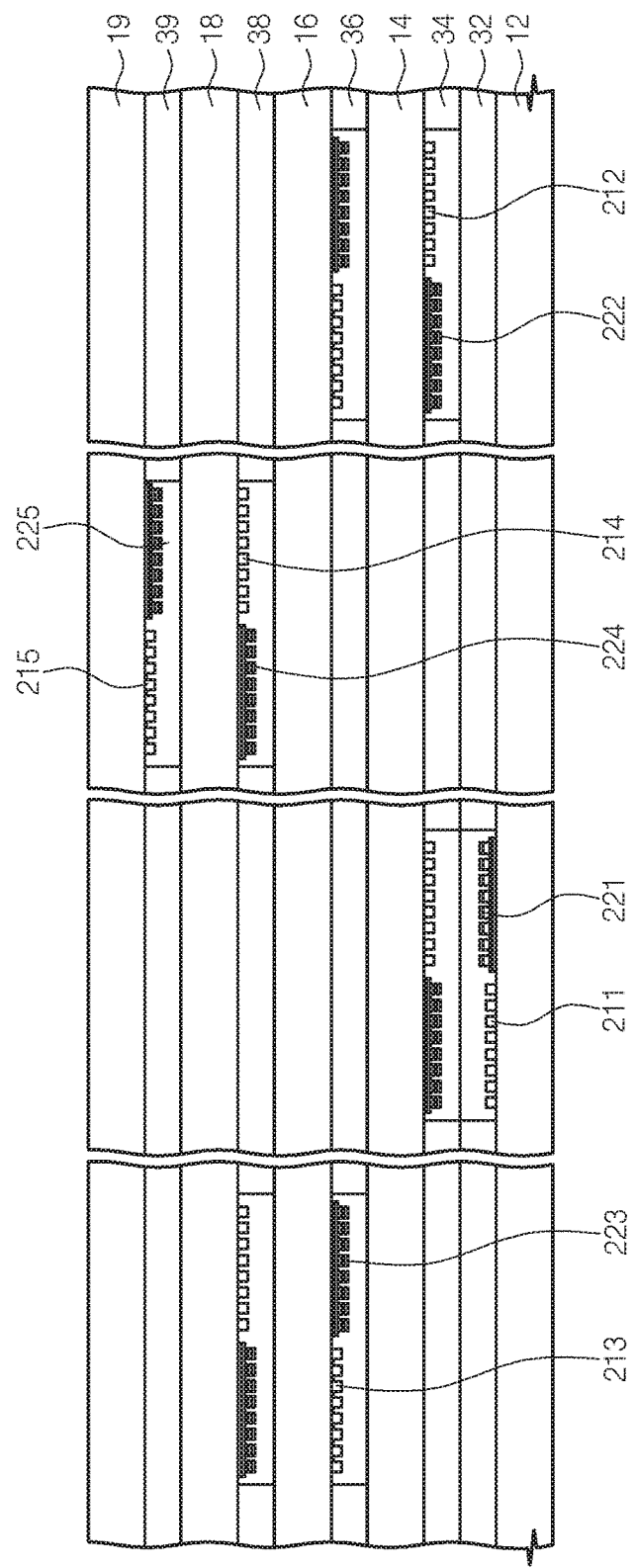
FIGS. 8 and 9 are a cross-sectional view and an exploded perspective view illustrating an opto-electronic system according to a third embodiment of the inventive concepts, respectively.
Figure 9:
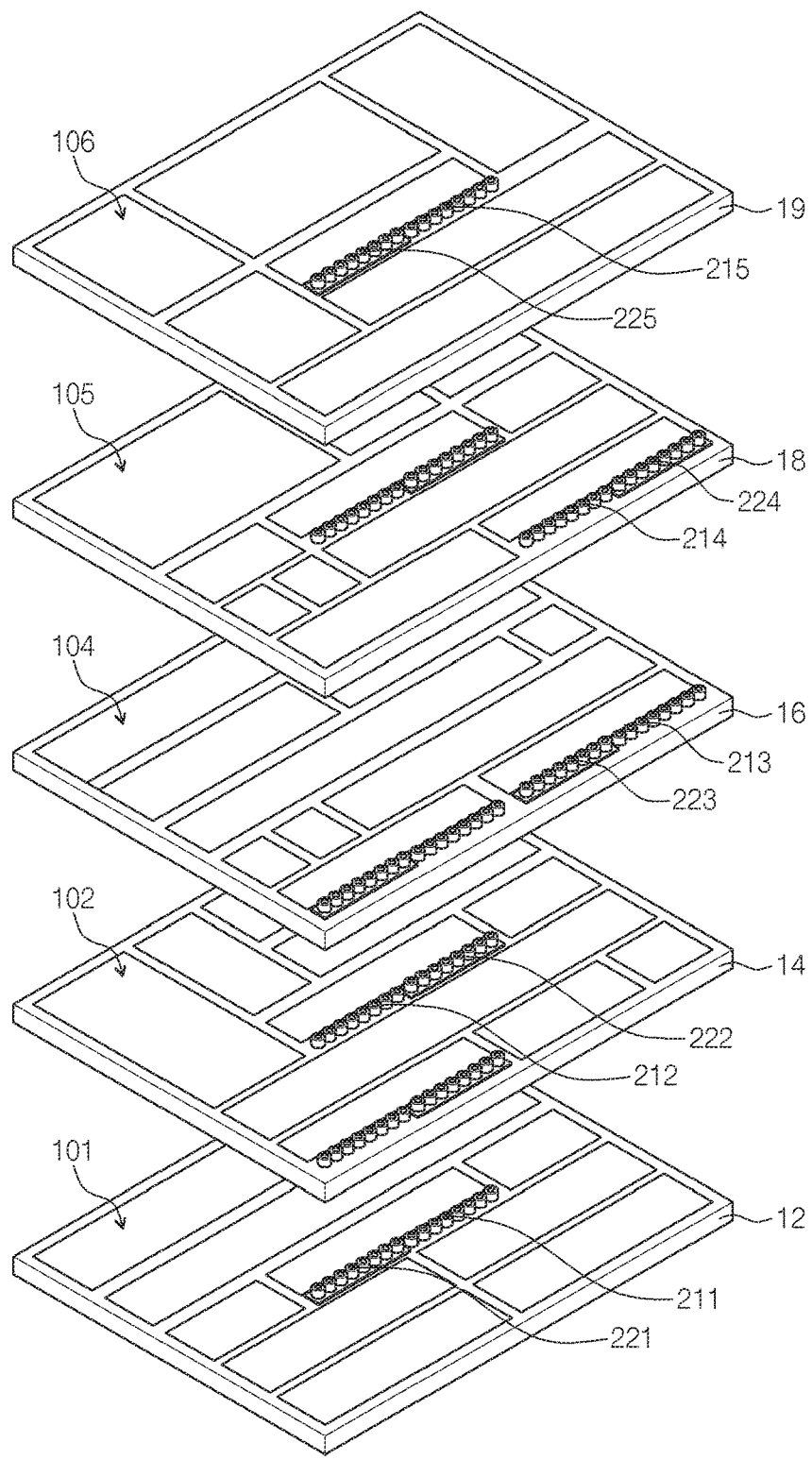

FIGS. 8 and 9 illustrate an opto-electronic system according to a third embodiment of the inventive concepts. In the present embodiment, the descriptions to the same elements as or similar elements to corresponding elements of the first embodiment will be omitted or mentioned briefly. In other words, differences between the present embodiment and the first embodiment will be mainly described.

Referring to FIGS. 8 and 9, an opto-electronic system according to a third embodiment may realize efficient chip-to-chip optical interconnection in a three-dimensionally stacked multi-chip system. For example, signal processing chips 101, 102, 104, 105, and 106 may be a CPU 101, a memory circuit 102, an ASIC 104, a data bus interface circuit 105, and an optical communication circuit 106, respectively.

The signal processing chips 101, 102, 104, 105, and 106 may include first to fifth optical detection elements 211 to 215 and first to fifth light source elements 221 to 225 monolithically integrated on first to fifth bulk silicon substrates 12, 14, 16, 18, and 19, respectively. For example, first vertical-input light detection elements 211 and first vertical-output light source elements 221 may be monolithically integrated in the first bulk silicon substrate 12 in an array form. Second vertical-input light detection elements 212 and second vertical-output light source elements 222 may be monolithically integrated in the second bulk silicon substrate 14 in an array form. Third vertical-input light detection elements 213 and third vertical-output light source elements 223 may be monolithically integrated in the third bulk silicon substrate 16 in an array form. Fourth vertical-input light detection elements 214 and fourth vertical-output light source elements 224 may be monolithically integrated in the fourth bulk silicon substrate 18 in an array form. Fifth vertical-input light detection elements 215 and fifth vertical-output light source elements 225 may be monolithically integrated in the fifth bulk silicon substrate 19 in an array form.

An optical signal may be three-dimensionally transmitted between the first to fifth optical detection elements 211 to 215 and the light source elements 221 to 225. The optical signal may be transmitted between the first vertical-input light detection elements 211 and the vertical-output light source elements 222 or between the first vertical-output light source elements 221 and the second vertical-input light detection elements 212. A fourth passivation layer 32 and a fifth passivation layer 34 may be disposed between the first vertical-input light detection elements 211 and the second vertical-output light source elements 222 and between the first vertical-output light source elements 221 and the second vertical-input light detection elements 212.

Likewise, the second to fifth vertical-input light detection elements 212 to 215 and the second to fifth vertical-output light source elements 222 to 225 may be aligned with each other to adjacently face each other in one-to-one correspondence (light source element to optical detection element). Additionally, sixth to eighth passivation layers 34, 38, and 39 may be provided. Thus, the plurality of signal processing chips may be three-dimensionally optically coupled to each other.

FIGS. 10 to 17 are cross-sectional views illustrating a method of manufacturing an opto-electronic system according to a first embodiment of the inventive concepts.

Figure 10:
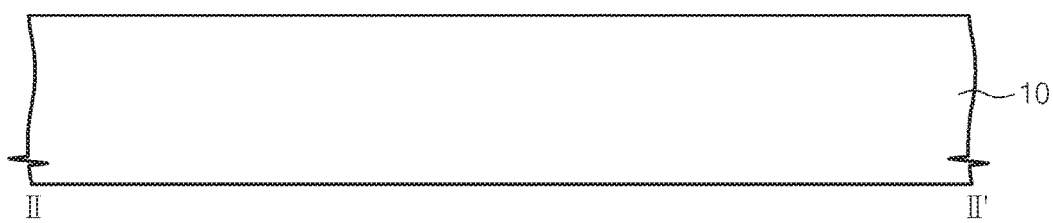
FIGS. 10 to 17 are cross-sectional views illustrating a method of manufacturing an opto-electronic system according to a first embodiment of the inventive concepts.

Referring to FIG. 10, a bulk silicon substrate 10 is provided. Providing the bulk silicon substrate 10 may include processes of manufacturing the signal processing device 100 and the CMOs interface circuitry 230.

Figure 11:
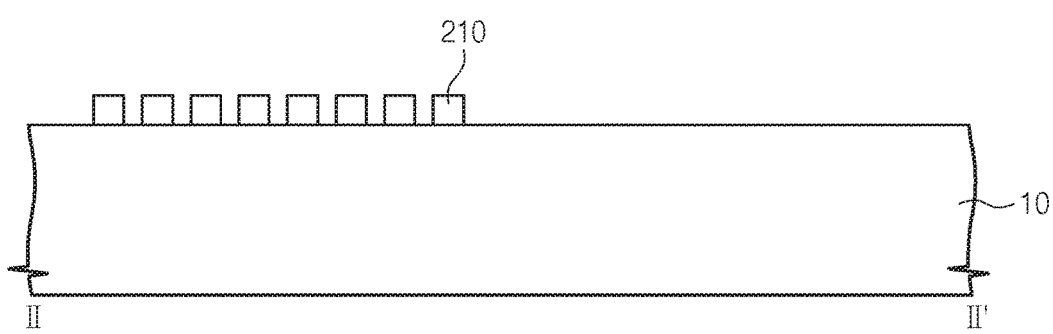

Referring to FIGS. 1 and 11, vertical-input light detection elements 210 are monolithically integrated on a portion of the bulk silicon substrate 10. The vertical-input light detection elements 210 may include vertical-input germanium photodiodes (germanium-on-silicon) grown on a surface of the bulk silicon substrate 10. Germanium may be epitaxial-grown on the bulk silicon substrate 10. The vertical-input light detection elements 210 may be monolithically integrated along with the signal processing device 110 and the CMOS interface circuitry 230 through batchwise processes. However, the inventive concepts are not limited thereto. The processes of forming the vertical-input light detection elements 210, the signal process device 110 and the CMOS interface circuitry 230 may be variously modified. For example, the vertical-input light detection elements 210 may include photodiodes including $Ge_{1-x}Si_x/Ge_{1-y}Si_y$ superlattice ($0 \le x,y \le 1$), germanium-based quantum dots, or a germanium-based quantum wire array. Alternatively, the vertical-input light detection elements 210 may include silicon photodiodes.

Figure 12:
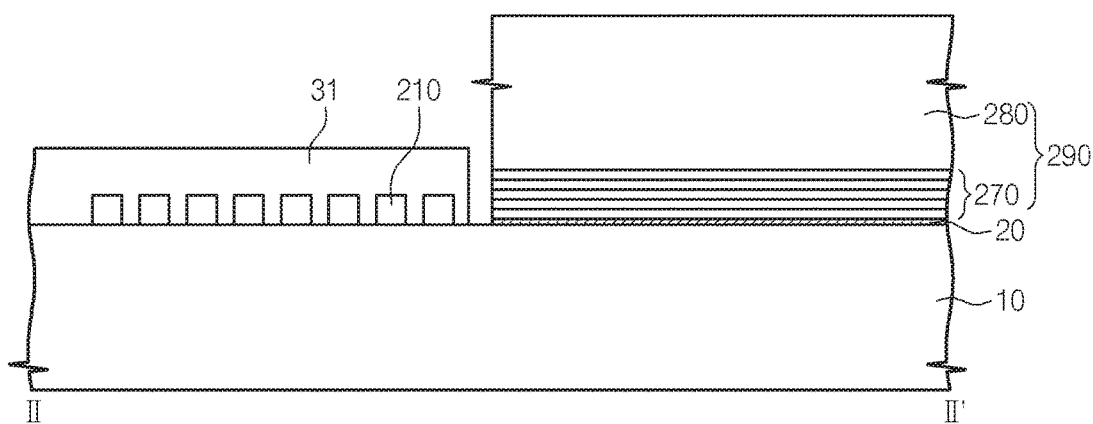

Referring to FIGS. 1 and 12, after an element passivation layer 31 may be formed on the vertical-input light detection elements 210, the CMOS interface circuitry 230 and the signal processing device 110 monolithically integrated on the portion of the bulk silicon substrate 10, a wafer 290 is bonded to another portion of the bulk silicon substrate 10. The element passivation layer 31 may cover the vertical-input light detection elements 210. The wafer 290 may include a III-V compound semiconductor substrate 280 and a III-V compound semiconductor light source active layer 270 on the III-V compound semiconductor substrate 280. The III-V compound semiconductor substrate 280 being a dummy substrate may include a gallium arsenide substrate, an indium phosphide substrate, or a gallium nitride substrate. The III-V compound semiconductor light source active layer 270 may be adhered to the bulk silicon substrate 10 by an adhesive layer 20 or may be bonded to the bulk silicon substrate 10 by a wafer bonding method. The adhesive layer 20 may include a silicon oxide layer or an adhesive material. The adhesive layer 20 may be the silicon oxide layer for the wafer bonding method.

Figure 13:
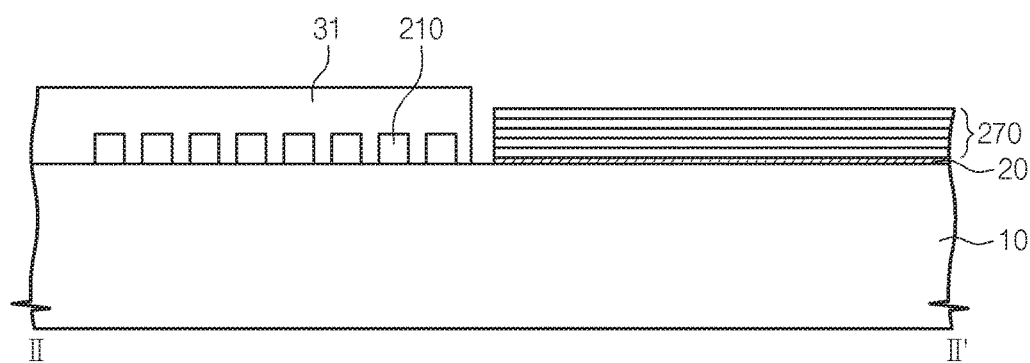

Referring to FIG. 13, the III-V compound semiconductor substrate 280 corresponding to the dummy substrate is removed. The III-V compound semiconductor substrate 280 may be removed by an etching method. The element passivation layer 31 may protect the vertical-input light detection elements 210 from an etch gas or an etch solution when the III-V compound semiconductor substrate 280 is removed.

Figure 14:
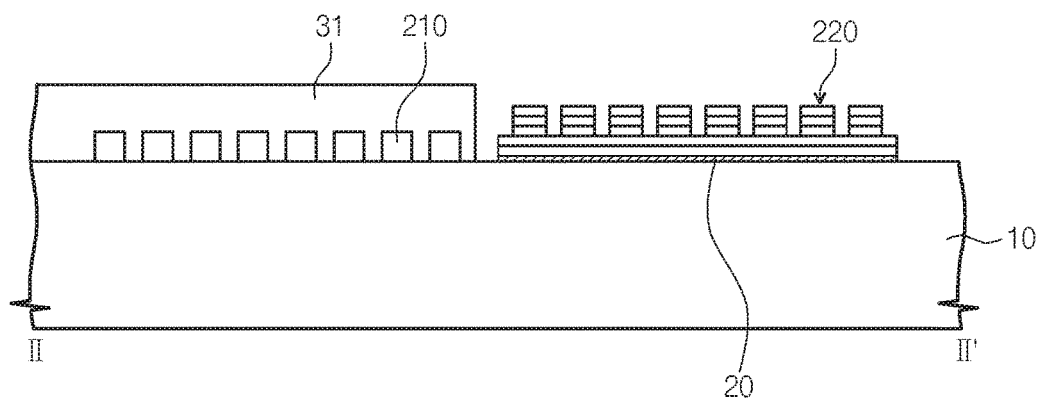

Referring to FIGS. 1 and 14, the III-V compound semiconductor light source active layer 270 is patterned to form vertical-output light source elements 220 (e.g., surface emitting lasers). The patterning process of the III-V compound semiconductor light source active layer 270 may include a plurality of photolithography processes and etching processes. The element passivation layer 31 may protect the vertical-input light detection elements 210 during the patterning process of the III-V compound semiconductor light source active layer 270. If the patterning process of the III-V compound semiconductor light source active layer 270 is finished, metal inter connections (not shown) may be monolithically integrated to electrically connect electrodes of the vertical-output light source elements 220 and the vertical-input light detection elements 210 to the CMOS interface circuitry 230. The vertical-output light source elements 220 may have a height of ~several μm to a few tens μm and an area of several tens $μm^2$ to several thousands $μm^2$ according to a kind thereof. The vertical-output light source elements 220 and the vertical-input light detection elements 210 may be monolithically integrated on the bulk silicon substrate 10 cheaper than a conventional SOI substrate. Additionally, the manufacturing method of the inventive concepts is based on normal bulk silicon CMOS processes, such that the introduction of the optical I/O device in the opto-electronic convergence silicon chip may be realized by the minimum additional processes/additional costs. The inventive concepts have merits of high performance, high speed, high efficiency, high level function, low manufacture costs, and low packaging costs. Overall, the inventive concepts may greatly simplify composition of the opto-electronic convergence integrated circuit (IC). The inventive concepts may provide practical optical I/O devices and optical interconnection compositions for chip-to-chip optical communication. Additionally, the inventive concepts may provide composition (or structure) advantageous to optical interconnection between three-dimensionally stacked chips.

Figure 15:
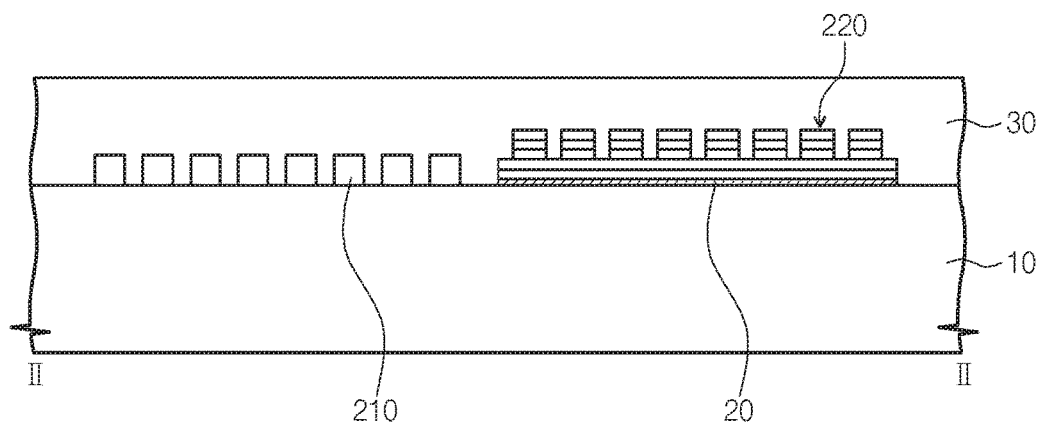

Referring to FIG. 15, a first passivation layer 30 is formed on the vertical-input light detection elements 210 and the vertical-output light source elements 220. The first passivation layer 30 may include a silicon oxide layer formed by a chemical vapor deposition (CVD) method or an atomic layer deposition (ALD) method. Here, the first passivation layer 30 may include the element passivation layer 31. The element passivation layer 31 may protect the vertical-input light detection elements 210, but the first passivation layer 30 may have an optical guiding characteristic. The element passivation layer may be formed in plural when the vertical-input light detection elements 210 are formed. The first passivation layer 30 may protect the vertical-input light detection elements 210 and the vertical-output light source elements 220 and may function as optical guides of the vertical-input light detection elements 210 and the vertical-output light source elements 220. However, the inventive concepts are not limited thereto. Embodiments of the inventive concepts may be variously modified. For example, after the element passivation layer 31 is removed, the first passivation layer 30 may be formed on the bulk silicon substrate 10.

Figure 16:
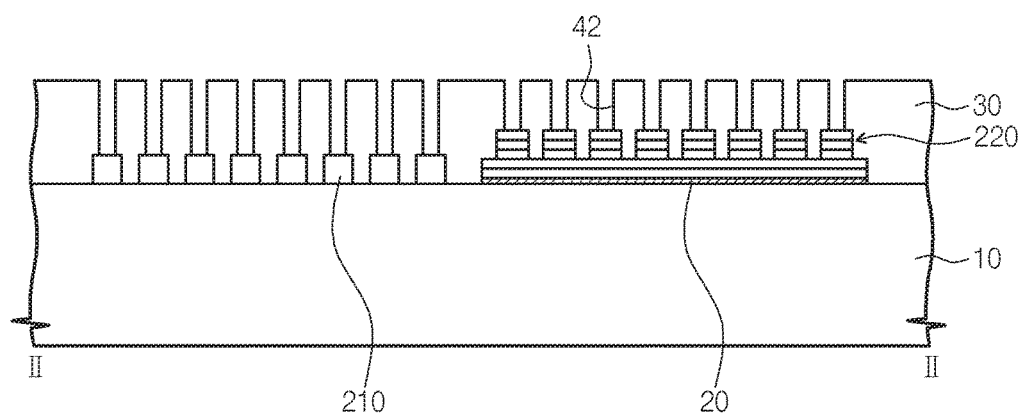

Referring to FIG. 16, the first passivation layer is locally etched to form holes 42 exposing the vertical-input light detection elements 210 and the vertical-output light source elements 220. The holes 42 may be formed by a photolithography process and an etching process. The etching process of the first passivation layer 30 may include a dry etching method.

Figure 17:
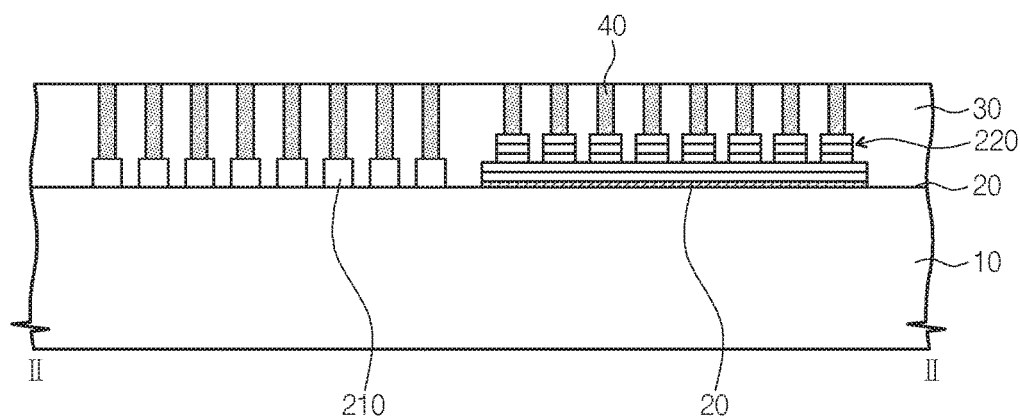

Referring to FIG. 17, optical vias 40 are formed in the holes 42, respectively. The optical vias 40 may include a silicon nitride layer formed by a CVD method or an ALD method.

Figure 18A:
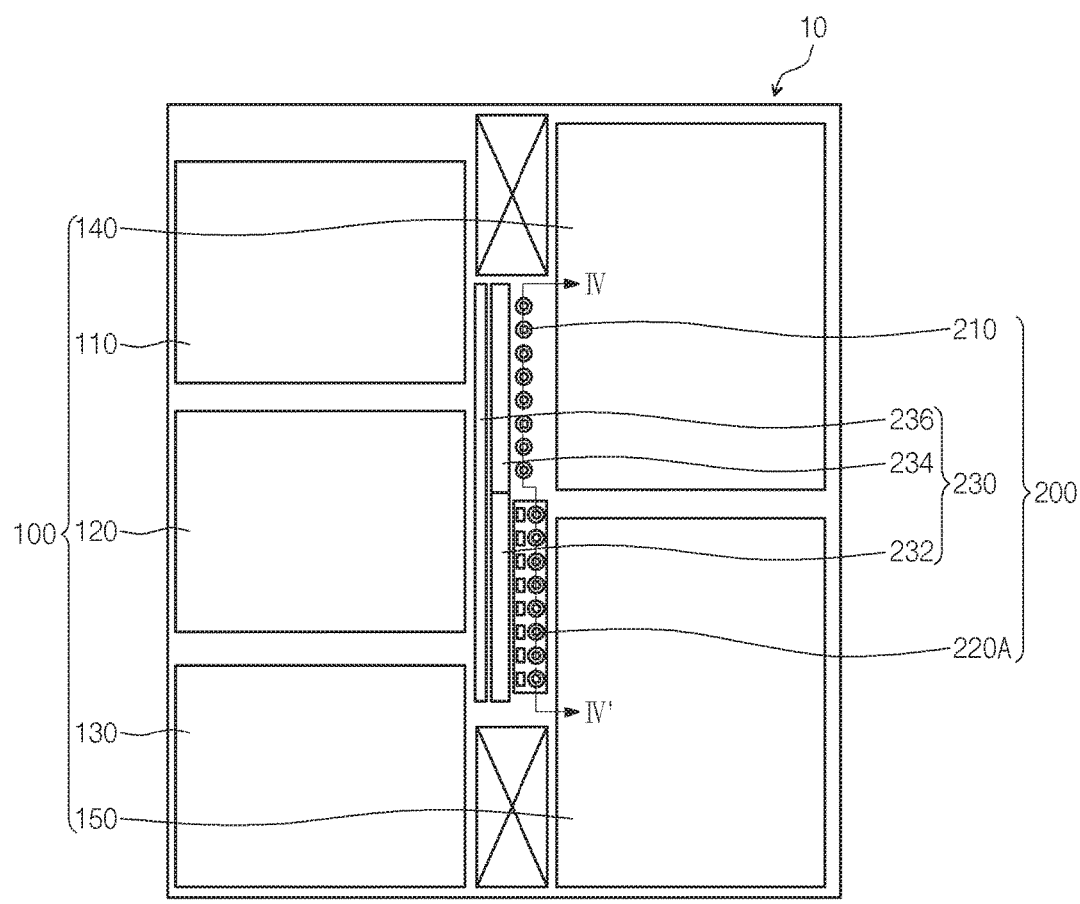
FIGS. 18A and 18B are plan views illustrating opto-electronic systems according to a fourth embodiment of the inventive concepts.
Figure 18B:
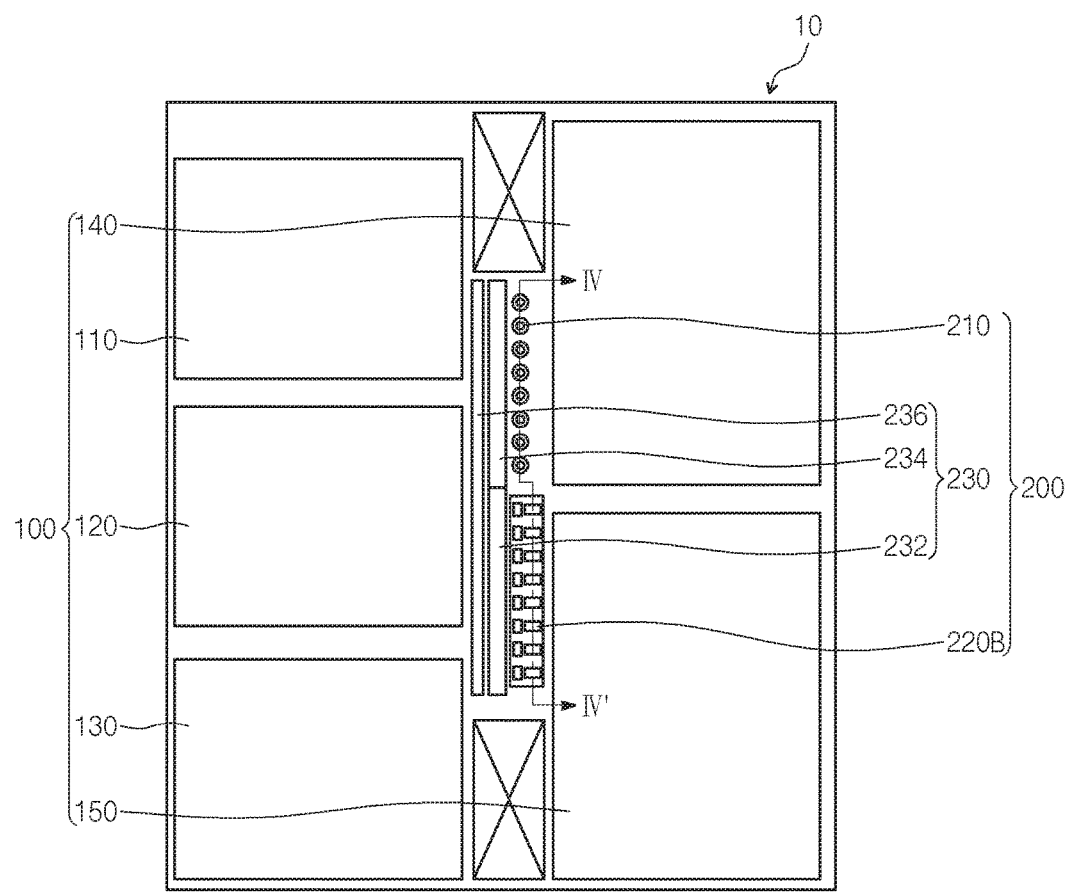
Figure 19:
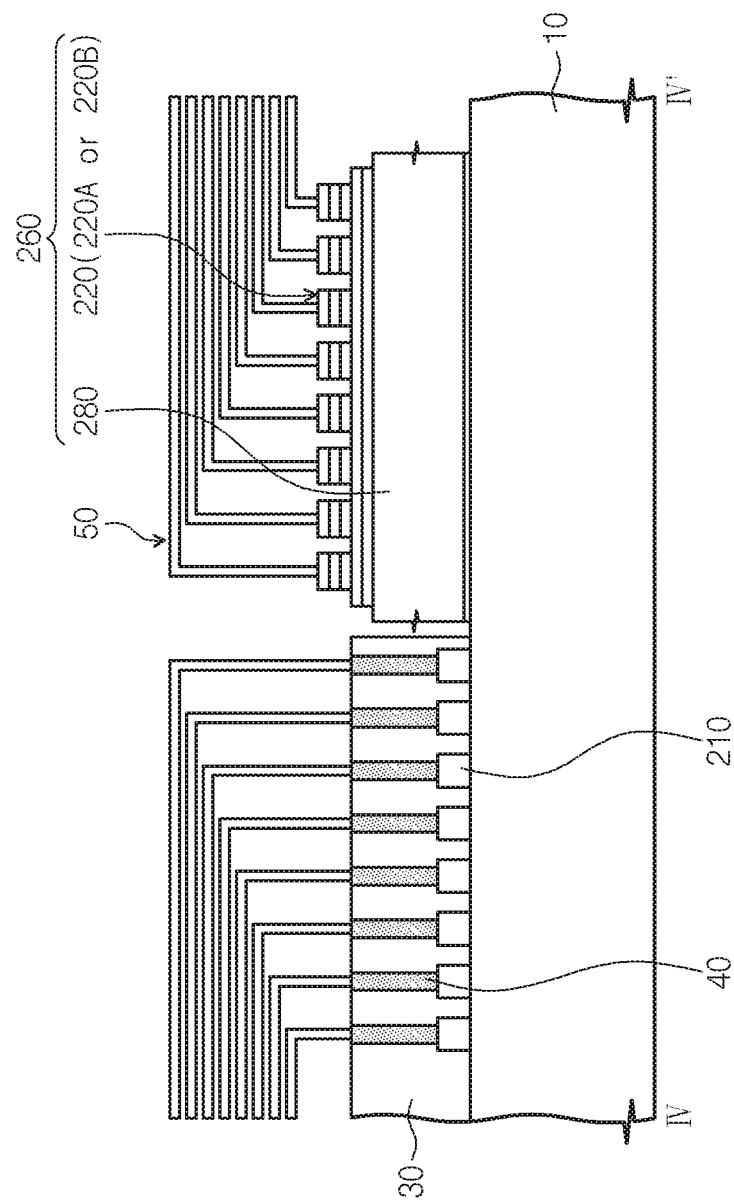
FIG. 19 is a cross-sectional view taken along a line IV-IV' of FIG. 18A or 18B.

FIGS. 18A and 18B are plan views illustrating opto-electronic systems according to a fourth embodiment of the inventive concepts. FIG. 19 is a cross-sectional view taken along a line IV-IV' of FIG. 18A or 18B. In the present embodiment, the descriptions to the same elements as or similar elements to corresponding elements of the first embodiment will be omitted or mentioned briefly. In other words, differences between the present embodiment and the first embodiment will be mainly described.

Referring to FIGS. 18A, 18B, and 19, in an optical I/O device 200 according to a fourth embodiment, a chip die 260 may be mounted using a die bonding method on a bulk silicon substrate 10 on which vertical-input light detection elements 210 are formed. The chip die 260 may include a III-V compound semiconductor substrate 280 and vertical-output light source elements 220 on the III-V compound semiconductor substrate 280. The vertical-output light source elements 220 may be formed from a III-V compound semiconductor light source active layer.

Even though not shown in the drawings, the vertical-output light source elements 220 (e.g., surface emitting lasers) may be electrically connected to the bulk silicon substrate 10 and/or the CMOS interface circuitry 230 by a wire bonding method or a flip chip bump bonding method. The optical I/O device 200 of the fourth embodiment further include the III-V compound semiconductor substrate 280 on which the vertical-output light source elements 220 are mounted, as compared with the first embodiment.

As described above, the optical I/O device according to embodiments of the inventive concepts includes the vertical-input light detection elements and the vertical-output light source elements (e.g., the surface emitting laser or the surface emitting LED) that are monolithically integrated on the bulk silicon substrate. The vertical-input light detection elements may include a germanium photodiode grown form the bulk silicon substrate. The vertical-output light source elements may include the III-V compound semiconductor layer bonded to the bulk silicon substrate by the wafer bonding method. The vertical-input light detection elements and the wafer-bonded vertical-output light source elements may be monolithically integrated on the bulk silicon substrate. Additionally, the optical I/O device may further include optical vias on the vertical-input light detection elements and the vertical-output light source elements, and the passive optical circuit such as the optical waveguide-based the WDM device. Thus, the optical I/O device and the opto-electronic system including the same according to the embodiments may provide the high function/high performance convergence chip system for bulk silicon substrate-based silicon optical communication and interconnection and may improve productivity.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing an optical input/output device, the method comprising:
   providing a bulk silicon substrate;
   monolithically integrating a vertical-input light detection element on a portion of the bulk silicon substrate; and
   monolithically integrating a vertical-output light source element on another portion of the bulk silicon substrate,
   wherein monolithically integrating the vertical-output light source element comprises:
   forming an element passivation layer covering the vertical-input light detection element on the portion of the bulk silicon substrate;
   bonding a wafer including a III-V compound semiconductor light source active layer on the III-V compound semiconductor substrate to the other portion of the bulk silicon substrate;
   removing the III-V compound semiconductor substrate;
   device-fabricating the III-V compound semiconductor light source active layer to form the vertical-output light source element on the bulk silicon substrate; and
   forming a passivation layer on the vertical-input light detection element and the vertical-output light source element,
   wherein the portion of the bulk silicon substrate is on a same plane of the bulk silicon substrate as the other portion of the bulk silicon substrate.

2. The method of claim 1, further comprising:
   etching the passivation layer to form holes exposing the vertical-input light detection element and the vertical-output light source element;
   forming optical vias in the holes, respectively;
   forming horizontal optical waveguides onto the passivation layer, the horizontal optical waveguides coupled to the optical vias; and
   forming a passive optical circuit on the passivation layer, the passive optical circuit coupled to the horizontal optical waveguide, and the passive optical circuit including optical multiplexer/demultiplexer (MUX/DEMUX), an optical switch, or a grating coupler.

3. The method of claim 1, wherein the same plane of the bulk silicon substrate is an upper surface of the bulk silicon substrate.

* * * * *